United States Patent
Liu et al.

(10) Patent No.: US 12,514,086 B2
(45) Date of Patent: Dec. 30, 2025

(54) DISPLAY SUBSTRATE AND DISPLAY DEVICE EACH HAVING CONNECTING TRACE CONNECTING DRIVE CIRCUIT PIN AND FLEXIBLE CIRCUIT BOARD PIN AND METHOD FOR MANUFACTURING THE DISPLAY SUBSTRATE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Hong Liu, Beijing (CN); Jingyi Xu, Beijing (CN); Peng Liu, Beijing (CN); Yongqiang Zhang, Beijing (CN); Bo Huang, Beijing (CN); Guodong Wang, Beijing (CN); Wanzhi Chen, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 421 days.

(21) Appl. No.: 18/016,931

(22) PCT Filed: Jan. 28, 2022

(86) PCT No.: PCT/CN2022/074676
§ 371 (c)(1),
(2) Date: Jan. 19, 2023

(87) PCT Pub. No.: WO2023/141962
PCT Pub. Date: Aug. 3, 2023

(65) Prior Publication Data
US 2024/0130187 A1    Apr. 18, 2024

(51) Int. Cl.
    H10K 59/131    (2023.01)
    H10K 59/12     (2023.01)
    (Continued)

(52) U.S. Cl.
    CPC ..... H10K 59/1315 (2023.02); H10K 59/1201 (2023.02); H10K 59/127 (2023.02); H10K 59/1275 (2023.02); H10K 59/8792 (2023.02)

(58) Field of Classification Search
    CPC ........... H10K 59/1315; H10K 59/1201; H10K 59/8792; H10K 59/127; H10K 59/1275
    See application file for complete search history.

(56) References Cited

U.S. PATENT DOCUMENTS

2007/0159563 A1    7/2007  Moriwaki
2012/0218237 A1*   8/2012  Shimada ............ G02F 1/13452
                                              345/204
(Continued)

FOREIGN PATENT DOCUMENTS

CN    1996604 A      7/2007
CN    201548780 U    8/2010
(Continued)

*Primary Examiner* — Michael Jung
(74) *Attorney, Agent, or Firm* — WHDA, LLP

(57) ABSTRACT

The application provides a display substrate, a method for manufacturing the same, and a display device. The display substrate includes a display region and a binding region located at a periphery of the display region. The binding region is provided with a drive circuit pin and a flexible circuit board pin, and a connecting trace for connecting the drive circuit pin and the flexible circuit board pin. The connecting trace includes a first connecting line and a second connecting line connected in parallel, the first connecting line and the second connecting line are in different layers, the first connecting line is between an interlayer insulating layer and a base substrate of the display substrate, the first connecting line and the interlayer insulating layer (Continued)

are separated by a first insulating layer, and the second connecting line is on a side of the interlayer insulating layer away from the base substrate.

10 Claims, 3 Drawing Sheets

(51) Int. Cl.
*H10K 59/127* (2023.01)
*H10K 59/80* (2023.01)

(56) References Cited

U.S. PATENT DOCUMENTS

| | | | |
|---|---|---|---|
| 2013/0257841 A1* | 10/2013 | Shim | G02F 1/13454 |
| | | | 345/212 |
| 2017/0194411 A1* | 7/2017 | Park | H10K 59/873 |
| 2018/0033969 A1* | 2/2018 | Kamijo | G02F 1/1345 |
| 2018/0226302 A1 | 8/2018 | Zhou | |
| 2022/0102560 A1* | 3/2022 | Tanaka | H10D 86/481 |
| 2022/0393085 A1 | 12/2022 | Cheng et al. | |

FOREIGN PATENT DOCUMENTS

| | | |
|---|---|---|
| CN | 106098628 A | 11/2016 |
| CN | 107863356 A | 3/2018 |
| CN | 104752514 B | 5/2018 |
| CN | 109148541 A | 1/2019 |
| CN | 109686742 A | 4/2019 |
| CN | 209434190 U | 9/2019 |
| WO | 2021/254242 A1 | 12/2021 |

\* cited by examiner

DISPLAY SUBSTRATE AND DISPLAY DEVICE EACH HAVING CONNECTING TRACE CONNECTING DRIVE CIRCUIT PIN AND FLEXIBLE CIRCUIT BOARD PIN AND METHOD FOR MANUFACTURING THE DISPLAY SUBSTRATE

CROSS-REFERENCE TO RELATED APPLICATION

This application is the U.S. national phase of PCT Application No. PCT/CN2022/074676 filed on Jan. 28, 2022, the entire contents of which are hereby incorporated by reference.

TECHNICAL FIELD

The present disclosure relates to the field of display technologies, and more particularly, to a display substrate, a method for manufacturing the same, and a display device.

BACKGROUND

OLED (Organic Light-Emitting Diode) display devices have been listed as the most promising next-generation display technology due to their advantages such as thin thickness, light weight, wide viewing angle, active light emission, continuously adjustable emission colour, low cost, fast response, low power consumption, low driving voltage, wide operating temperature range, simple production process, high light emission efficiency and flexible display.

SUMMARY

The technical problem to be solved by the present disclosure is to provide a display substrate, a method for manufacturing the same, and a display device, which can prevent the display device from the occurrence of black spots.

In order to solve the above technical problem, the embodiments of the present disclosure provide the following technical solutions.

In an aspect, a display substrate is provided, including a display region and a binding region located at the periphery of the display region, where the binding region is provided with a drive circuit pin and a flexible circuit board pin, and a connecting trace for making the drive circuit pin and the flexible circuit board pin to be connected. The connecting trace includes a first connecting line and a second connecting line that are connected in parallel, the first connecting line and the second connecting line are arranged in different layers, the first connecting line is located between an interlayer insulating layer of the display substrate and a base substrate of the display substrate, the first connecting line and the interlayer insulating layer are separated by a first insulating layer, and the second connecting line is located on a side of the interlayer insulating layer away from the base substrate. An orthographic projection of the first connecting line onto the base substrate overlaps an orthographic projection of the second connecting line onto the base substrate, and the first connecting line and the second connecting line are connected through a via hole penetrating the interlayer insulating layer and the first insulating layer.

In some embodiments, the first connecting line is fabricated by using a light-shielding metal layer of the display substrate, and the second connecting line is fabricated by using a source/drain metal layer of the display substrate.

In some embodiments, the light-shielding metal layer includes a first metal layer, a second metal layer and a third metal layer that are laminated, the second metal layer is made of Al, and the first metal layer and the third metal layer are made of Ti or Mo.

In some embodiments, the first connecting line and the second connecting line are separated by the first insulating layer and the interlayer insulating layer, the second connecting line is connected to the first connecting line via the via hole penetrating the first insulating layer and the interlayer insulating layer, and the via hole has a diameter of 2 um to 3 um.

In some embodiments, each of the first connecting line and a corresponding one of the second connecting line are connected in parallel to form one of the connecting trace, and each of the first connecting line and the corresponding second connecting line are connected via a plurality of via holes.

In some embodiments, a ratio of an area of a first orthographic projection of the first connecting line onto the base substrate to an area of a second orthographic projection of the second connecting line onto the base substrate is between 1:0.8 and 1:1.2.

In some embodiments, the first orthographic projection coincides with the second orthographic projection.

An embodiment of the present disclosure further provides a display device including the display substrate described above.

An embodiment of the present disclosure further provides a method for manufacturing a display substrate, the display substrate includes a display region and a binding region located at a periphery of the display region, the binding region is provided with a drive circuit pin and a flexible circuit board pin, and a connecting trace for making the drive circuit pin and the flexible circuit board pin to be connected. The method includes forming the connecting trace, which includes: forming a first connecting line and a second connecting line which are connected in parallel, the first connecting line and the second connecting line are arranged in different layers, the first connecting line is located between an interlayer insulating layer of the display substrate and a base substrate of the display substrate, the first connecting line and the interlayer insulating layer are separated by a first insulating layer, and the second connecting line is located on a side of the interlayer insulating layer away from the base substrate. An orthographic projection of the first connecting line onto the base substrate overlaps an orthographic projection of the second connecting line onto the base substrate, and the first connecting line and the second connecting line are connected through a via hole penetrating the interlayer insulating layer and the first insulating layer.

In some embodiments, the forming the connecting trace includes: forming the first connecting line by using a light-shielding metal layer of the display substrate; and forming the second connecting line by using a source/drain metal layer of the display substrate.

The embodiments of present disclosure has the following beneficial effects. In the solution described above, the connecting trace includes the first connecting line and the second connecting line which are connected in parallel, the first connecting line is located between the interlayer insulating layer and the base substrate, and the first connecting line and the interlayer insulating layer are separated by the first insulating layer. In this way, when performing an activation process on the interlayer insulating layer after forming the first connecting line and the interlayer insulating layer, the first connecting line can be protected from the high temperature of the activation process, and the first connecting line will not be melt, because the first connecting line is separated from the interlayer insulating layer by the first insulating layer, in one aspect, the first connecting line is far away from the interlayer insulating layer, and in the other aspect, the first insulating layer can protect the first connecting line. In addition, the second connecting line is located on a side of the interlayer insulating layer away from the base substrate, and is fabricated after the interlayer insulating layer has been subjected to the activation process, and is also not affected by the activation process of the interlayer insulating layer. The technical solution of the present embodiment can ensure the performance of the connecting trace, prevent the occurrence of black spots of the connecting trace, and further prevent black spots from occurring on the display device.

REFERENCE NUMERALS

Figure 1:
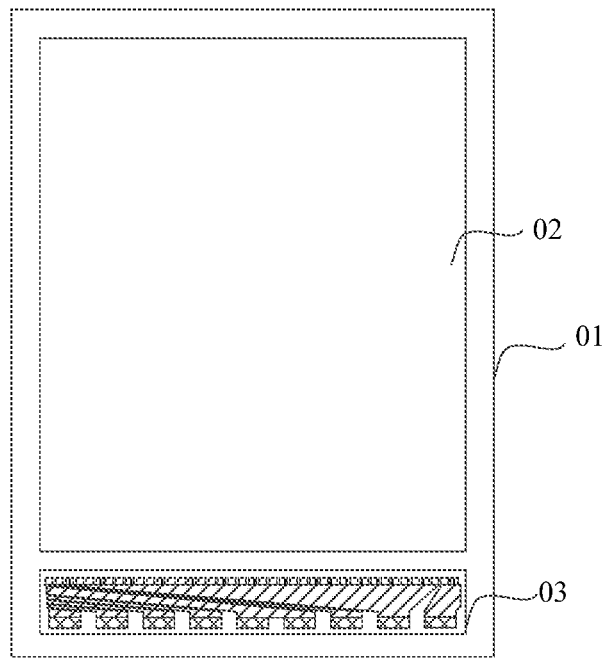
FIG. 1 is a planar schematic diagram of a display substrate.

01 Display substrate
02 Display region
03 Binding region
04 Drive circuit pin
05 Connecting trace
06 Flexible circuit board pin
07 Base substrate
08 Buffer layer
09 Gate insulating layer
10 Interlayer insulating layer
11, 13 Trace
12 Passivation layer
14 First connecting line
15 Second connecting line
18 Via hole.

DETAILED DESCRIPTION

In order that the to-be-solved technical problems, technical solutions, and advantages of the embodiments of the present disclosure will become more apparent, a detailed description will be given below with reference to the accompanying drawings and specific embodiments.

Figure 2:
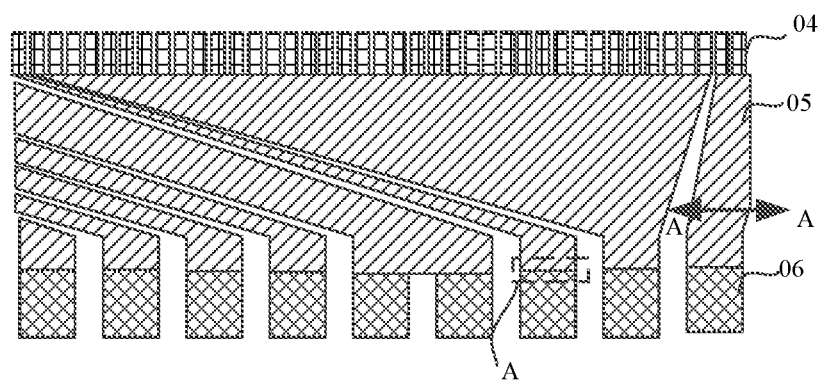
FIG. 2 is a schematic diagram of a connection between a flexible circuit board pin and a drive circuit pin.

As shown in FIG. 1, a display substrate 01 includes a display region 02 and a binding region 03. As shown in FIG. 2, a drive circuit (IC) pin 04 and a flexible circuit board (FPC) pin 06 are provided in the binding region 03, wherein the drive circuit pin 04 is connected to a signal line of the display region, and the flexible circuit board pin 06 is used for binding with the flexible circuit board. The flexible circuit board pin 06 and the drive circuit pin 04 are connected via a connecting trace 05.

Figure 3:
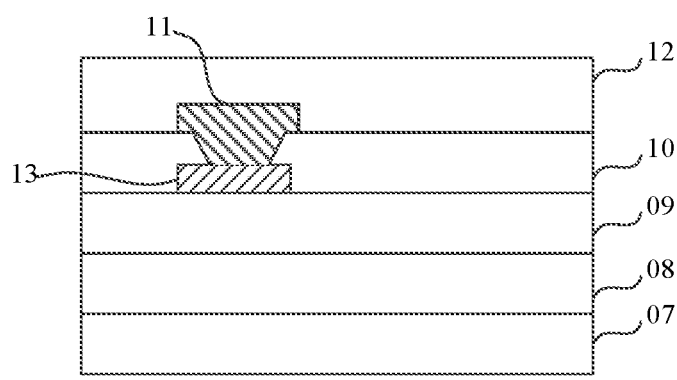
FIG. 3 is a schematic diagram of a connecting trace in the related art.

FIG. 3 is a schematic cross-sectional view in the direction AA of FIG. 2. When the display substrate is applied in a small and medium-sized display product, in order to satisfy the resistance requirement of the connecting trace 05, as shown in FIG. 3, a gate metal layer is used to make the trace 13, a source/drain metal layer is used to make the trace 11, and the trace 11 and the trace 13 are connected in parallel to form the connecting trace 05.

Figure 4:
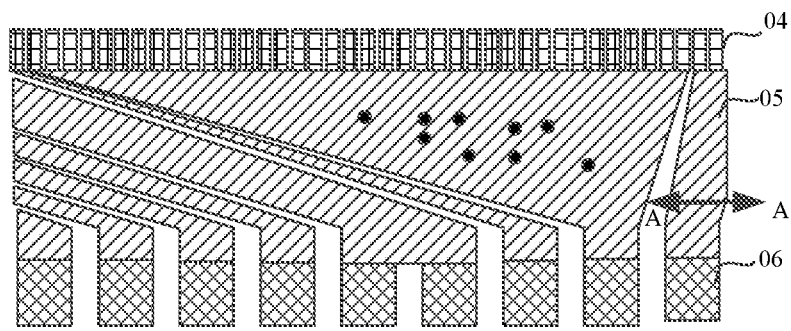
FIG. 4 is a schematic diagram illustrating black spots of a display device in the related art.

In order to reduce the resistance of the trace 13, the gate metal layer adopts a stacked structure of Mo/Al/Mo, and as shown in FIG. 3, the display substrate includes a base substrate 07, a buffer layer 08, a gate insulating layer 09, an interlayer insulating layer 10, and a passivation layer 12, which are laminated in sequence, wherein the interlayer insulating layer 10 is in contact with the gate metal layer and is formed after the gate metal layer is formed. After the interlayer insulating layer 10 is formed, it needs to perform an activation process on the interlayer insulating layer 10. The temperature of the activation process is up to 580V, and a high temperature may cause heat to concentrate in the center of the trace 13 with a large area, causing Al to be melted, forming bubbles to lift up the surface layer Mo, and finally forming defects such as black spots. As shown in FIG. 4, in order to alleviate the black spots, the temperature of the activation process may be reduced, for example, the temperature of the activation process may be reduced to 540° C. or 520° C. However, the reduced temperature of the activation process may affect the activation effect, affect the electrical characteristics of the display substrate, and then affect the quality of displayed images.

Embodiments of the present disclosure is to provide a display substrate, a method for manufacturing the same and a display device, which can prevent the display device from the occurrence of black spots.

An embodiment of the present disclosure provides a display substrate, including a display region and a binding region located at a periphery of the display region, the binding region is provided with a drive circuit pin and a flexible circuit board pin, and a connecting trace for making the drive circuit pin and the flexible circuit board pin to be connected, wherein the connecting trace includes a first connecting line and a second connecting line connected in parallel, the first connecting line and the second connecting line are arranged in different layers, the first connecting line is located between an interlayer insulating layer of the display substrate and a base substrate of the display substrate, the first connecting line and the interlayer insulating layer are separated by a first insulating layer interposed therebetween, and the second connecting line is located on a side of the interlayer insulating layer away from the base substrate.

In this embodiment, the connecting trace includes the first connecting line and the second connecting line which are connected in parallel, the first connecting line is located between the interlayer insulating layer and the base substrate the first connecting line and the interlayer insulating layer are separated by the first insulating layer interposed therebetween. In this way, when performing an activation process on the interlayer insulating layer after forming the first connecting line and the interlayer insulating layer, the first connecting line can be protected from the high temperature of the activation process, and the first connecting line will not be melt, because the first connecting line is separated from the interlayer insulating layer by the first insulating layer, in one aspect, the first connecting line is far away from the interlayer insulating layer, and in the other aspect, the first insulating layer can protect the first connecting line. In addition, the second connecting line is located on a side of the interlayer insulating layer away from the base substrate, and is fabricated after the interlayer insulating layer has been subjected to the activation process, and is also not affected by the activation process of the interlayer insulating layer. The technical solution of the present embodiment can ensure the performance of the connecting trace, prevent the occurrence of black spots of the connecting trace, and further prevent black spots from occurring on the display device.

In this embodiment, in order to satisfy the resistance requirement of the connecting trace, the connecting trace is formed by connecting the first connecting line and the second connecting line in parallel. The first connecting line may be made of the same material as an original film layer of the display substrate, and thus the first connecting line may be made in a same patterning process while making the film layer of the display substrate, thereby reducing the number of patterning processes for making the display substrate. The second connecting line may be made of the same material as an original film layer of the display substrate, so that the second connecting line may be made in the same patterning process when making the film layer of the display substrate, thereby reducing the number of patterning processes for making the display substrate.

In some embodiments, the first connecting line may be fabricated by using a light-shielding metal layer of the display substrate, and the second connecting line may be fabricated by using a source/drain metal layer of the display substrate. Of course, it is not limited that the first connecting line is fabricated by using the light-shielding metal layer of the display substrate, and it is not limited that the second connecting line is fabricated by using the source/drain metal layer of the display substrate.

Figure 5:
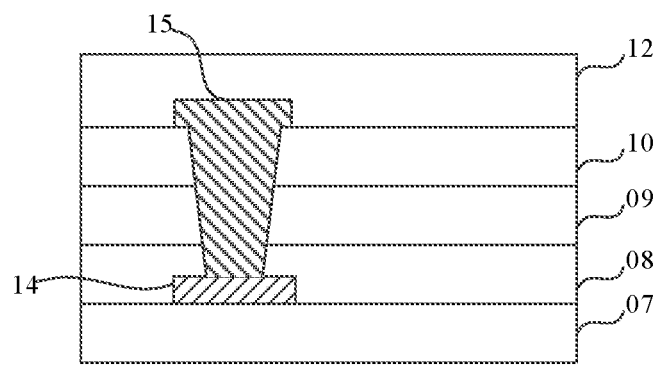
FIGS. 5 to 10 are schematic diagrams of connecting traces in accordance with an embodiment of the present disclosure.

In a particular example, as shown in FIG. 5, the display substrate includes a base substrate 07, a first connecting line 14 made of a light-shielding metal layer, a buffer layer 08, a gate insulating layer 09, an interlayer insulating layer 10, a second connecting line 15 made of a source/drain metal layer, and a passivation layer 12, which are laminated in sequence. The first connecting line 14 and the second connecting line 15 are connected through a via hole penetrating the buffer layer 08, the gate insulating layer 09 and the interlayer insulating layer 10, where the buffer layer 08 and the gate insulating layer 09 constitute a first insulating layer. Each of the first connecting line corresponds to one of the second connecting line, and each first connecting line and the corresponding second connecting line are connected in parallel to form the connecting trace.

In this embodiment, the via hole connecting the first connecting line 14 and the second connecting line 15 may be an elliptical via hole, a circular via hole or a rectangular via hole. The via hole being an elliptical via hole means that a cross section of the via hole in a direction parallel to the base substrate is elliptical. The via hole being a circular via hole means that the cross section of the via hole in the direction parallel to the base substrate is circular. The via hole being a rectangular via hole means that the cross section of the via hole in the direction parallel to the base substrate is rectangular. In some embodiments, the via hole may be a rectangular via hole, and the side length of the rectangle may be 2 um to 3 um.

Since the via hole needs to penetrate through a plurality of film layers and has a relatively large depth, in order to ensure a reliable connection between the first connecting line 14 and the second connecting line 15, each first connecting line and the corresponding second connecting line may be connected via a plurality of via holes, and the plurality of via holes may be arranged in a row or in a matrix.

The shape of the first connecting line 14 may or may not be the same as the shape of the second connecting line 15. A first orthographic projection of the first connecting line 14 onto the base substrate may fall within a second orthographic projection of the second connecting line 15 onto the base substrate, or the second orthographic projection of the second connecting line 15 onto the base substrate falls within the first orthographic projection of the first connecting line 14 onto the base substrate, or the first orthographic projection of the first connecting line 14 onto the base substrate coincides with the second orthographic projection of the second connecting line 15 onto the base substrate.

In some embodiments, a ratio of an area of a first orthographic projection of the first connecting line onto the base substrate to an area of a second orthographic projection of the second connecting line onto the base substrate is between 1:0.8 and 1:1.2. When the ratio of the area of the first orthographic projection of the first connecting line onto the base substrate to the second orthographic projection of the second connecting line onto the base substrate is in a range 1:0.8 to 1:1.2, it can be ensured that the connecting trace formed by connecting the first connecting line and the second connecting line in parallel has a lower resistance.

In order to further reduce the resistance of the connecting trace, the first connecting line and the second connecting line may adopt a laminated structure. In some embodiments, when the first connecting line is fabricated by using a light-shielding metal layer, the light-shielding metal layer may include a first metal layer, a second metal layer and a third metal layer which are laminated. The second metal layer is made of Al, and the first metal layer and the third metal layer each is made of Ti or Mo. That is, the light-shielding metal layer is made of a laminated structure of Ti/Al/Ti or Mo/Al/Mo, so that the square resistance of the light-shielding metal layer can be greatly reduced, thereby reducing the square resistance of the first connecting line and reducing the square resistance of the connecting trace.

When the Mo/Al/Mo laminated structure is used, the thickness of the light-shielding metal layer may be 1800 Å to 2800 Å, for example, the thickness of the top layer Mo is 500 Å, the thickness of the middle layer Al is 1000 Å, and the thickness of the bottom layer Mo is 300 Å; and when the thickness of the light-shielding metal layer varies, the thicknesses of the top layer Mo and the bottom layer Mo keep constant, and the thickness of the middle layer A1 may be fluctuated between 1000 Å and 2000 Å. Alternatively, the light-shielding metal layer may have a laminated structure of Al/Mo, and may have a thickness of 800 Å to 2000 Å, a top layer Mo having a thickness of 500 Å, and a bottom Al layer having a thickness fluctuating between 300 Å and 1500 Å. The Mo layer and the Al layer may be prepared in a physically sputtering manner, and Mo and Al target materials are used for sputtering to form a film. When the light-shielding metal layer adopts the Mo/Al/Mo laminated structure, both sides of Al layer are covered with Mo layers, which can prevent oxidation and warping of Al layer.

The slope angle of the first connecting line formed by the light-shielding metal layer may be between 30° and 60°. In order to ensure the slope angle of the light-shielding metal layer, the light-shielding metal layer may be etched in three stages when the first connecting line is formed by etching, wherein the etching is performed in three etching chambers for 50 s respectively, the etching temperature is 40±1.0V, and the etching liquid may be $HNO_3$, $CH_3COOH$ and/or $H_3PO_4$.

In an embodiment, when the second connecting line is fabricated by using the source/drain metal layer, the source/ drain metal layer may include a first metal layer, a second metal layer and a third metal layer which are laminated. The second metal layer is made of Al, and the second metal layer and the third metal layer are made of Ti or Mo, namely, the source/drain metal layer is made of a laminated structure of Ti/Al/Ti or Mo/Al/Mo, so that the square resistance of the source/drain metal layer can be greatly reduced, thereby reducing the square resistance of the second connecting line and reducing the square resistance of the connecting trace.

When the Mo/Al/Mo laminated structure is used for the source/drain metal layer, the thickness of the source/drain metal layer may be 1800 Å to 2800 Å, for example, the thickness of the top layer Mo is 500 Å, the thickness of the middle layer Al is 1000 Å, and the thickness of the bottom layer Mo is 300 Å; when the thickness of the source/drain metal layer varies, the thicknesses of the top layer Mo and the bottom layer Mo keep constant, and the thickness of the middle layer Al may be fluctuated between 1000 Å and 2000 Å. Alternatively, the source/drain metal layer may have a laminated structure of Al/Mo, and may have a thickness of 800 Å to 2000 Å, a top Mo layer having a thickness of 500 Å, and a bottom Al layer having a thickness fluctuating between 300 Å and 1500 Å. The Mo layer and the Al layer may be prepared by physical sputtering, and the Mo and Al target materials are used for sputtering to form a film. When the source/drain metal layer adopts the Mo/Al/Mo laminated structure, both sides of Al layer are covered with Mo layers, which can prevent oxidation and warping of Al layer.

The slope angle of the second connecting line formed by the source/drain metal layer may be between 30° and 60°. In order to ensure the slope angle of the source/drain metal layer, the source/drain metal layer may be etched in three stages when the second connecting line is formed by etching, wherein the etching is performed in three etching chambers for 50 s respectively, the etching temperature is 40±1.0V, and the etching liquid may be $HNO_3$, $CH_3COOH$ and/or $H_3PO_4$.

Figure 6:
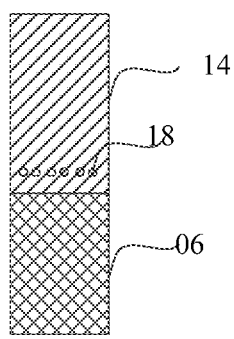
Figure 7:
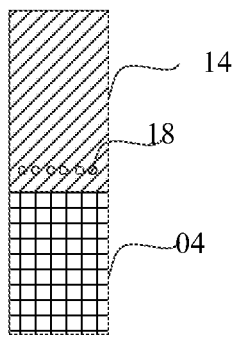
Figure 8:
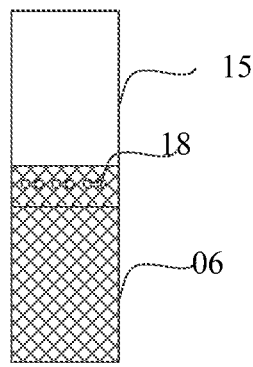
Figure 9:
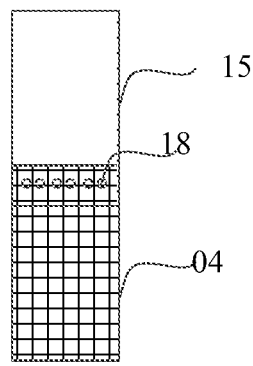

In an embodiment, the connecting trace may be formed by the first connecting line and the second connecting line connected in parallel, wherein the first connecting line or the second connecting line is connected to the drive circuit pin and the flexible circuit board pin, or the first connecting line and the second connecting line are both connected to the drive circuit pin and the flexible circuit board pin. When the first connecting line 14 is connected to the drive circuit pin 04 and the flexible circuit board pin 06, in order to ensure the reliable connection between the first connecting line to the drive circuit pin and the flexible circuit board pin, as shown in FIG. 6 and FIG. 7, each first connecting line 14 may be connected to a corresponding one of the drive circuit pin 04 and a corresponding one of the flexible circuit board pin 06 via a plurality of via holes 18, and the plurality of via holes 18 may be arranged in a row and may also be arranged in a matrix. When the second connecting line is connected with the drive circuit pin and the flexible circuit board pin, in order to ensure a reliable connection of the second connecting line to the drive circuit pin and the flexible circuit board pin, as shown in FIG. 8 and FIG. 9, each second connecting line 15 may be connected with the corresponding drive circuit pin 04 and flexible circuit board pin 06 via a plurality of via holes 18, and the plurality of via holes 18 may be arranged in a row or in a matrix.

Figure 10:
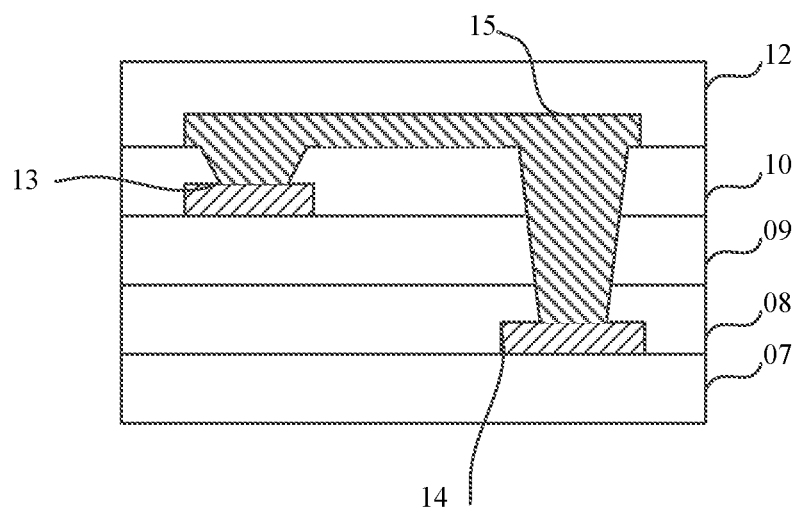

In some embodiments, as shown in FIG. 10, the parallel connection of the first connecting line 14 and the second connecting line 15 may be realized through a jumper design between the light shielding metal layer and the source/drain metal layer, so as to satisfy the resistance requirement of a connecting trace (R<0.1Ω).

An embodiment of the present disclosure further provides a display device, which includes the display substrate described above.

The display device includes, but not limited to: a radio frequency unit, a network module, an audio output unit, an input unit, a sensor, a display unit, a user input unit, an interface unit, a memory, a processor, a power supply, etc. It will be appreciated by those skilled in the art that the configuration of the display device described above is not constructed as a limitation to a display device, and the display device may include more or fewer of the components described above, or some combinations of the components, or different arrangements of the components. In embodiments of the present disclosure, the display device includes, but is not limited to, a display, a cell phone, a tablet, a television, a wearable electronic device, a navigation display device, etc.

The display device may be: any product or component with a display function, such as a television, a display, a digital photo frame, a mobile phone, a tablet computer, and among others, the display device further includes a flexible circuit board, a printed circuit board and a back panel.

In the display device provided by the embodiment, the connecting trace includes the first connecting line and the second connecting line which are connected in parallel, the first connecting line is located between the interlayer insulating layer and the base substrate, and the first connecting line and the interlayer insulating layer are separated by the first insulating layer. In this way, when performing an activation process on the interlayer insulating layer after forming the first connecting line and the interlayer insulating layer, the first connecting line can be protected from the high temperature of the activation process, and the first connecting line will not be melt, because the first connecting line is separated from the interlayer insulating layer by the first insulating layer, in one aspect, the first connecting line is far away from the interlayer insulating layer, and in the other aspect, the first insulating layer can protect the first connecting line. In addition, the second connecting line is located on a side of the interlayer insulating layer away from the base substrate, and is fabricated after the interlayer insulating layer has been subjected to the activation process, and is also not affected by the activation process of the interlayer insulating layer. The technical solution of the present embodiment can ensure the performance of the connecting trace, prevent the occurrence of black spots of the connecting trace, and further prevent black spots from occurring on the display device.

An embodiment of the present disclosure further provides a method for manufacturing a display substrate, the display substrate includes a display region and a binding region located at a periphery of the display region, the binding region is provided with a drive circuit pin and a flexible circuit board pin, and a connecting trace for connecting the drive circuit pin and the flexible circuit board pin. The method includes forming the connecting trace, which includes: forming a first connecting line and a second connecting line that are connected in parallel, the first connecting line and the second connecting line are arranged in different layers, the first connecting line is located between an interlayer insulating layer of the display substrate and a base substrate of the display substrate, the first connecting line and the interlayer insulating layer are separated by a first insulating layer interposed therebetween, and the second connecting line is located on a side of the interlayer insulating layer away from the base substrate.

In this embodiment, the connecting trace includes the first connecting line and the second connecting line which are connected in parallel, the first connecting line is located between the interlayer insulating layer and the base substrate, and the first connecting line and the interlayer insulating layer are separated by the first insulating layer. In this way, when performing an activation process on the interlayer insulating layer after forming the first connecting line and the interlayer insulating layer, the first connecting line can be protected from the high temperature of the activation process, and the first connecting line will not be melt, because the first connecting line is separated from the interlayer insulating layer by the first insulating layer, in one aspect, the first connecting line is far away from the interlayer insulating layer, and in the other aspect, the first insulating layer can protect the first connecting line. In addition, the second connecting line is located on a side of the interlayer insulating layer away from the base substrate, and is fabricated after the interlayer insulating layer has been subjected to the activation process, and is also not affected by the activation process of the interlayer insulating layer. The technical solution of the present embodiment can ensure the performance of the connecting trace, prevent the occurrence of black spots of the connecting trace, and further prevent black spots from occurring on the display device.

In this embodiment, in order to satisfy the resistance requirement of the connecting trace, the connecting trace is formed by connecting the first connecting line and the second connecting line in parallel. The first connecting line may be made of the same material as an original film layer of the display substrate, and thus the first connecting line may be made in a same patterning process while making the film layer of the display substrate, thereby reducing the number of patterning processes for making the display substrate. The second connecting line may be made of the same material as an original film layer of the display substrate, so that the second connecting line may be made in the same patterning process when making the film layer of the display substrate, thereby reducing the number of patterning processes for making the display substrate.

In some embodiments, the forming the connecting trace includes: forming the first connecting line by using a light-shielding metal layer of the display substrate; and forming the second connecting line by using a source/drain metal layer of the display substrate.

Of course, it is not limited to that the first connecting line is fabricated by using the light-shielding metal layer of the display substrate, and it is not limited to that the second connecting line is fabricated by using the source/drain metal layer of the display substrate.

In a particular example, as shown in FIG. 5, the display substrate includes a base substrate 07, a first connecting line 14 made of a light-shielding metal layer, a buffer layer 08, a gate insulating layer 09, an interlayer insulating layer 10, a second connecting line 15 made of a source/drain metal layer, and a passivation layer 12, which are laminated in sequence. The first connecting line 14 and the second connecting line 15 are connected through a via hole penetrating the buffer layer 08, the gate insulating layer 09 and the interlayer insulating layer 10, where the buffer layer 08 and the gate insulating layer 09 constitute a first insulating layer. Each of the first connecting line corresponds to one of the second connecting line, and each first connecting line and the corresponding second connecting line are connected in parallel to form the connecting trace.

In this embodiment, the via hole connecting the first connecting line 14 and the second connecting line 15 may be an elliptical via hole, a circular via hole or a rectangular via hole. The via hole being an elliptical via hole means that a cross section of the via hole in a direction parallel to the base substrate is elliptical. The via hole being a circular via hole means that the cross section of the via hole in the direction parallel to the base substrate is circular. The via hole being a rectangular via hole means that the cross section of the via hole in the direction parallel to the base substrate is rectangular. In some embodiments, the via hole may be a rectangular via hole, and the side length of the rectangle may be 2 um to 3 um.

Since the via hole needs to penetrate through a plurality of film layers and has a relatively large depth, in order to ensure a reliable connection between the first connecting line 14 and the second connecting line 15, each first connecting line and the corresponding second connecting line may be connected via a plurality of via holes, and the plurality of via holes may be arranged in a row or in a matrix.

A via hole is made after the interlayer insulating layer 10 is formed, a photoresist is coated on the interlayer insulating layer 10, the photoresist is exposed using a mask plate, and a photoresist pattern is formed after development. The photoresist pattern is used as a mask to etch the interlayer insulating layer 10, the gate insulating layer 09 and the buffer layer 08. Since the via hole needs to penetrate multiple film layers, as compared with FIG. 3 where the via hole only needs to penetrate the interlayer insulating layer 10, the etching time needs to be increased, for example, when forming a via hole penetrating the interlayer insulating layer 10 in FIG. 3, the etching time may be about 1500 ms, and when forming a via hole penetrating the interlayer insulating layer 10, the gate insulating layer 09 and the buffer layer 08 in FIG. 5, the etching time needs to be increased to about 1700 ms.

The shape of the first connecting line 14 may or may not be the same as the shape of the second connecting line 15. A first orthographic projection of the first connecting line 14 onto the base substrate may fall within a second orthographic projection of the second connecting line 15 onto the base substrate, or the second orthographic projection of the second connecting line 15 onto the base substrate falls within the first orthographic projection of the first connecting line 14 onto the base substrate, or the first orthographic projection of the first connecting line 14 onto the base substrate coincides with the second orthographic projection of the second connecting line 15 onto the base substrate.

In some embodiments, a ratio of an area of a first orthographic projection of the first connecting line onto the base substrate to an area of a second orthographic projection of the second connecting line onto the base substrate is between 1:0.8 and 1:1.2. When the ratio of the area of the first orthographic projection of the first connecting line onto the base substrate to the second orthographic projection of the second connecting line onto the base substrate is in a range 1:0.8 to 1:1.2, it can be ensured that the connecting trace formed by connecting the first connecting line and the second connecting line in parallel has a lower resistance.

In order to further reduce the resistance of the connecting trace, the first connecting line and the second connecting line may adopt a laminated structure. In some embodiments, when the first connecting line is fabricated by using a light-shielding metal layer, the light-shielding metal layer may include a first metal layer, a second metal layer and a third metal layer which are laminated. The second metal layer is made of Al, and the first metal layer and the third metal layer each is made of Ti or Mo. That is, the light-shielding metal layer is made of a laminated structure of Ti/Al/Ti or Mo/Al/Mo, so that the square resistance of the light-shielding metal layer can be greatly reduced, thereby reducing the square resistance of the first connecting line and reducing the square resistance of the connecting trace.

When the Mo/Al/Mo laminated structure is used, the thickness of the light-shielding metal layer may be 1800 Å to 2800 Å, for example, the thickness of the top layer Mo is 500 Å, the thickness of the middle layer Al is 1000 Å, and the thickness of the bottom layer Mo is 300 Å; and when the thickness of the light-shielding metal layer varies, the thicknesses of the top layer Mo and the bottom layer Mo keep constant, and the thickness of the middle layer A1 may be fluctuated between 1000 Å and 2000 Å. Alternatively, the light-shielding metal layer may have a laminated structure of Al/Mo, and may have a thickness of 800 Å to 2000 Å, a top layer Mo having a thickness of 500 Å, and a bottom Al layer having a thickness fluctuating between 300 Å and 1500 Å. The Mo layer and the Al layer may be prepared in a physically sputtering manner, and Mo and Al target materials are used for sputtering to form a film. When the light-shielding metal layer adopts the Mo/Al/Mo laminated structure, both sides of Al layer are covered with Mo layers, which can prevent oxidation and warping of Al layer.

The slope angle of the first connecting line formed by the light-shielding metal layer may be between 30° and 60°. In order to ensure the slope angle of the light-shielding metal layer, the light-shielding metal layer may be etched in three stages when the first connecting line is formed by etching, wherein the etching is performed in three etching chambers for 50 s respectively, the etching temperature is 40±1.0V, and the etching liquid may be $HNO_3$, $CH_3COOH$ and/or $H_3PO_4$.

In an embodiment, when the second connecting line is fabricated by using the source/drain metal layer, the source/drain metal layer may include a first metal layer, a second metal layer and a third metal layer which are laminated. The second metal layer is made of Al, and the second metal layer and the third metal layer are made of Ti or Mo, namely, the source/drain metal layer is made of a laminated structure of Ti/Al/Ti or Mo/Al/Mo, so that the square resistance of the source/drain metal layer can be greatly reduced, thereby reducing the square resistance of the second connecting line and reducing the square resistance of the connecting trace.

When the Mo/Al/Mo laminated structure is used for the source/drain metal layer, the thickness of the source/drain metal layer may be 1800 Å to 2800 Å, for example, the thickness of the top layer Mo is 500 Å, the thickness of the middle layer Al is 1000 Å, and the thickness of the bottom layer Mo is 300 Å; when the thickness of the source/drain metal layer varies, the thicknesses of the top layer Mo and the bottom layer Mo keep constant, and the thickness of the middle layer A1 may be fluctuated between 1000 Å and 2000 Å. Alternatively, the source/drain metal layer may have a laminated structure of Al/Mo, and may have a thickness of 800 Å to 2000 Å, a top Mo layer having a thickness of 500 Å, and a bottom Al layer having a thickness fluctuating between 300 Å and 1500 Å. The Mo layer and the Al layer may be prepared by physical sputtering, and the Mo and Al target materials are used for sputtering to form a film. When the source/drain metal layer adopts the Mo/Al/Mo laminated structure, both sides of Al layer are covered with Mo layers, which can prevent oxidation and warping of Al layer.

The slope angle of the second connecting line formed by the source/drain metal layer may be between 30° and 60°. In order to ensure the slope angle of the source/drain metal layer, the source/drain metal layer may be etched in three stages when the second connecting line is formed by etching, wherein the etching is performed in three etching chambers for 50 s respectively, the etching temperature is 40±1.0V, and the etching liquid may be $HNO_3$, $CH_3COOH$ and/or $H_3PO_4$.

In an embodiment, the connecting trace may be formed by the first connecting line and the second connecting line connected in parallel, wherein the first connecting line or the second connecting line is connected to the drive circuit pin and the flexible circuit board pin, or the first connecting line and the second connecting line are both connected to the drive circuit pin and the flexible circuit board pin. When the first connecting line 14 is connected to the drive circuit pin 04 and the flexible circuit board pin 06, in order to ensure the reliable connection between the first connecting line to the drive circuit pin and the flexible circuit board pin, as shown in FIG. 6 and FIG. 7, each first connecting line 14 may be connected to a corresponding one of the drive circuit pin 04 and a corresponding one of the flexible circuit board pin 06 via a plurality of via holes 18, and the plurality of via holes 18 may be arranged in a row and may also be arranged in a matrix. When the second connecting line is connected with the drive circuit pin and the flexible circuit board pin, in order to ensure a reliable connection of the second connecting line to the drive circuit pin and the flexible circuit board pin, as shown in FIG. 8 and FIG. 9, each second connecting line 15 may be connected with the corresponding drive circuit pin 04 and flexible circuit board pin 06 via a plurality of via holes 18, and the plurality of via holes 18 may be arranged in a row or in a matrix.

It should be noted that the various embodiments described herein are described in a progressive manner, the same or similar parts of the various embodiments can refer to each other, and each embodiment focuses on differences from the other embodiments. In particular, the method embodiments are described more simply because they are substantially similar to the product embodiments, and for the interrelated part, the partial description of the product embodiments may be referred to.

Unless defined otherwise, technical or scientific terms used in this disclosure shall have the ordinary meaning as understood by one of ordinary skill in the art to which this disclosure belongs. Such terms as "first", "second" used herein do not denote any order, quantity, or importance, but rather are used to distinguish one element from another. Such terms as "comprise" or "include" mean that the presence of an element or item preceding the word covers the presence of the element or item listed after the word and equivalents thereof, but does not exclude other elements or items. Such terms as "connecting" or "connected" are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the above embodiments, particular features, structures, materials, or characteristics may be combined in any suitable manner in any one or more embodiments or examples.

The above implementations are just specific embodiments of the present disclosure, but the protection scope of the present disclosure is not limited thereto. A person of ordinary skill in the art can think of changes or equivalents within the technical scope of the present disclosure, which shall fall within the protection scope of the present disclosure. Therefore, the protection scope of the present disclosure shall be subjected to the claims.

What is claimed is:

1. A display substrate, comprising: a display region and a binding region located at a periphery of the display region, wherein the binding region is provided with a drive circuit pin and a flexible circuit board pin, and a connecting trace configured to make the drive circuit pin and the flexible circuit board pin to be connected,
    wherein the connecting trace comprises a first connecting line and a second connecting line that are connected in parallel, the first connecting line and the second connecting line are arranged in different layers, the first connecting line is located between an interlayer insulating layer of the display substrate and a base substrate of the display substrate, the first connecting line and the interlayer insulating layer are separated by a first insulating layer, and the second connecting line is located on a side of the interlayer insulating layer away from the base substrate;
    an orthographic projection of the first connecting line onto the base substrate overlaps an orthographic projection of the second connecting line onto the base substrate, and the first connecting line and the second connecting line are connected through a via hole penetrating the interlayer insulating layer and the first insulating layer;
    wherein the display substrate comprises the base substrate, the first connecting line, a buffer layer, a gate insulating layer, the interlayer insulating layer, the second connecting line, and a passivation layer laminated in sequence;
    the buffer layer and the gate insulating layer constitute the first insulating layer.

2. The display substrate according to claim 1, wherein the first connecting line is fabricated by using a light-shielding metal layer of the display substrate, and the second connecting line is fabricated by using a source/drain metal layer of the display substrate.

3. The display substrate according to claim 2, wherein the light-shielding metal layer comprises a first metal layer, a second metal layer and a third metal layer that are laminated, the second metal layer is made of Al, and the first metal layer and the third metal layer are made of Ti or Mo.

4. The display substrate according to claim 2, wherein a diameter of the via hole is 2 μm to 3 μm.

5. The display substrate according to claim 4, wherein each of the first connecting line and a corresponding one of the second connecting line are connected in parallel to form one of the connecting trace, and each of the first connecting line and the corresponding second connecting line are connected via a plurality of via holes.

6. The display substrate according to claim 1, wherein a ratio of an area of a first orthographic projection of the first connecting line onto the base substrate to an area of a second orthographic projection of the second connecting line onto the base substrate is between 1:0.8 and 1:1.2.

7. The display substrate according to claim 6, wherein the first orthographic projection coincides with the second orthographic projection.

8. A display device, comprising the display substrate according to claim 1.

9. A method for manufacturing a display substrate, wherein the display substrate comprises a display region and a binding region located at a periphery of the display region, the binding region is provided with a drive circuit pin and a flexible circuit board pin, and a connecting trace configured to make the drive circuit pin and the flexible circuit board pin to be connected, wherein the method comprises:
    forming the connecting trace, comprising:
        forming a first connecting line and a second connecting line that are connected in parallel, the first connecting line and the second connecting line are arranged in different layers, the first connecting line is located between an interlayer insulating layer of the display substrate and a base substrate of the display substrate, the first connecting line and the interlayer insulating layer are separated by a first insulating layer, and the second connecting line is located on a side of the interlayer insulating layer away from the base substrate;
        an orthographic projection of the first connecting line onto the base substrate overlaps an orthographic projection of the second connecting line onto the base substrate, and the first connecting line and the second connecting line are connected through a via hole penetrating the interlayer insulating layer and the first insulating layer;
    wherein the display substrate comprises the base substrate, the first connecting line, a buffer layer, a gate insulating layer, the interlayer insulating layer, the second connecting line, and a passivation layer laminated in sequence;
    the buffer layer and the gate insulating layer constitute the first insulating layer.

10. The method for manufacturing a display substrate according to claim 9, wherein the forming the connecting trace comprises:
    forming the first connecting line by using a light-shielding metal layer of the display substrate; and
    forming the second connecting line by using a source/drain metal layer of the display substrate.

* * * * *